United States Patent [19]

Marchywka et al.

[11] Patent Number: 5,891,575
[45] Date of Patent: Apr. 6, 1999

[54] GROWING AND RELEASING DIAMONDS

[75] Inventors: Michael J. Marchywka, Lanham, Md.; Pehr E. Pehrsson, Alexandria, Va.

[73] Assignee: United States as represented by the Secretary of the Navy, Washington, D.C.

[21] Appl. No.: 605,690

[22] Filed: Feb. 22, 1996

Related U.S. Application Data

[63] Continuation of Ser. No. 266,758, Jun. 28, 1994, Pat. No. 5,587,210.
[51] Int. Cl.$^6$ ..................................................... B01J 3/06
[52] U.S. Cl. ........................... 428/408; 428/212; 423/446
[58] Field of Search ..................................... 428/408, 212; 423/446

[56] References Cited

U.S. PATENT DOCUMENTS

| | | | |
|---|---|---|---|
| 5,001,452 | 3/1991 | Imai et al. | 338/13 |
| 5,082,522 | 1/1992 | Purdes et al. | 423/446 |
| 5,107,315 | 4/1992 | Kumagai et al. | 257/77 |
| 5,114,696 | 5/1992 | Purdes | 423/446 |
| 5,127,983 | 7/1992 | Imai et al. | 423/446 |
| 5,144,380 | 9/1992 | Kimoto et al. | 257/77 |
| 5,250,149 | 10/1993 | Kimoto et al. | 156/612 |
| 5,254,862 | 10/1993 | Kjumai et al. | 257/77 |
| 5,371,378 | 12/1994 | Das | 257/77 |
| 5,403,619 | 4/1995 | Cuomo et al. | 427/248.1 |
| 5,474,021 | 12/1995 | Tsuno et al. | 423/446 |
| 5,512,873 | 4/1996 | Saito et al. | 257/77 |

FOREIGN PATENT DOCUMENTS 479625  4/1992  European Pat. Off. .

OTHER PUBLICATIONS

Shiomi et al "Field–Effect Transistors using Boron–Doped Diamond Epitaxial Films" Jap. Journ. of Appl. Physics vol. 28, No. 12, Dec. 1989. pp. 2153–2154.

Okano et al "Characterization of Semiconducting Diamond Films and its Applicaton to Electronic Devices" Thin Solid Films 206(1991) 183–187.

*Primary Examiner*—A. A. Turner
*Attorney, Agent, or Firm*—Thomas E. McDonnell; George A. Kap

[57] ABSTRACT

A process for making diamond and diamond products includes the steps of implanting ions in a diamond substrate to form a damaged layer of non-diamond carbon below the top surface of the substrate, heating the substrate to about 600–1200° C., growing diamond on the top surface of the heated substrate by chemical vapor deposition, and electrochemically etching the damaged layer to separate the grown diamond from the substrate along the damage layer. The diamond product consists of a first diamond layer and a second diamond layer attached to the first layer. The second layer contains damage caused by ions traversing the second layer.

3 Claims, No Drawings

GROWING AND RELEASING DIAMONDS

This application is a continuation of application Ser. No. 08/266,758, filed Jun. 28, 1994 now U.S. Pat. No. 5,587,210.

FIELD OF THE INVENTION

This invention generally pertains to diamonds and more particularly to a product and a process for growing and releasing diamonds from a diamond substrate.

BACKGROUND OF THE INVENTION

Synthetic diamond can be epitaxially grown by chemical vapor deposition on a pre-existing diamond substrate. However, the availability of seed crystals limits the maximum diamond film dimensions to a few millimeters on a side. A larger, effective diamond seed size can be made by placing a number of smaller diamond seeds within a few to 10 microns of each other in a tiling or mosaicing process. Film growth will begin on each seed individually but the film will grow laterally as well as vertically and eventually the films will grow together to form a continuous film of large dimension.

Current attempts at forming a mosaic of seed crystals have concentrated on forming a thin layer of diamond of less than 1 micron thick obtained from the bulk seed crystals and then mosaicing a suitable substrate with these thin seeds. However, the seeds used in the mosaic are only useful for one film growth since the seeds are incorporated into the film.

The use of thin and thick diamond crystals, or a diamond for any purpose, is too expensive whether the diamond is natural or synthetic.

SUMMARY OF THE INVENTION

An object of this invention is preparation of a synthetic diamond thin film.

Another object of this invention is preparation of multiple diamonds and then tiling the diamonds and growing synthetic diamond thereover to produce a unitary diamond of a larger area.

Another object of this invention is the growth of a single crystal diamond on a single crystal diamond substrate having a layer of non-diamond carbon in it.

These and other objects of this invention are realized by ion implanting a diamond substrate to provide non-diamond carbon within the diamond substrate, growing a diamond on the diamond substrate, and electrochemically etching the non-diamond carbon to separate the grown diamond along the non-diamond carbon.

DETAILED DESCRIPTION OF THE INVENTION

Before ion implantation of the diamond substrate to create a non-diamond carbon layer below the top surface of the diamond substrate, the diamond substrate can be doped by ion implantation with suitable atoms to create n-type and p-type semiconductors, although considerable lattice damage takes place when the impurity atoms are introduced into a diamond structure. If too much damage is done, any subsequent annealing taking place graphitizes the diamond. If too little damage is done, the dopants end up in interstitial rather than substitutional sites after annealing. P-type diamonds are obtained by doping the diamond film typically with boron at a fluence of about $1 \times 10^{10}$ to $1 \times 10^{15}$ boron atoms/cm$^2$ at an energy of about $10^3$ to $10^7$ eV. N-type diamonds are obtained by doping the diamond film typically with phosphorous or lithium atoms at a fluence of about $1 \times 10^{10}$ to $3 \times 10^{15}$ atoms/cm$^2$ at an energy of about $10^3$ to $10^7$ eV.

Doping is very similar to ion implantation to create a damaged layer of non-diamond carbon. In either case, the implanting beam L consists of ions which become atoms once they are lodged in the substrate.

The step of forming a damaged layer of non-diamond carbon in the diamond substrate, preferably single crystal diamond, can be carried out by conventional ion implantation. Provision of the damaged layer of the non-diamond carbon in the substrate is done in such a way that the damaged layer is below the diamond cap layer or below the top surface of the substrate. The top surface of the diamond cap is the same as the top surface of the diamond surface on which diamond can be grown by chemical vapor deposition.

Ion implantation of a diamond substrate is effected by a high velocity ion beam. Typical ion kinetic energies of the beams range from about $1 \times 10^4$ to about $1 \times 10^7$ eV, which result in ion implantation depths of from about 10 nm to about 5 microns. The minimum dose of ions is about $10^{15}$ ions/cm$^2$ and is typically in the range from about $10^{16}$ to $10^{20}$ ions/cm$^2$. Irreversible and non-annealable damage can ensue when employing excessive ion doses. The duration of implantation is typically in the range of about 1 minute to 5 hours, especially in the approximate range of 5 minutes to 2 hours.

The ion current and its duration determine amount of ions that are implanted whereas the energy and the mass of the ions determine the average depth of the implant.

Both the path of the ion beam and the target substrate are typically in a vacuum since ions are easily stopped in a gas.

Ions which can be considered for implantation herein include carbon, arsenic, argon, aluminum, phosphorus, antimony, boron, nitrogen, oxygen, beryllium, selenium, silicon, sulfur, tellurium and zinc; especially carbon and argon.

Ions to be implanted are produced from a gaseous plasma mixture of ions and electrons. The ions are extracted from the plasma by a small electric field and are accelerated by a larger electric or magnetic field. The accelerated ions are usually passed through a strong magnetic field which allows separation and selection of a single ionic species having a narrow energy range. After the desired ions have been separated out, they are focused by electrostatic or magnetic lenses. The resulting ion beam is then directed at the substrate.

Nitrogen can be implanted in a diamond substrate directly from plasma at low to moderate energy. This can be done by placing the substrate in the plasma and applying a voltage of about $10^4$–$10^5$ volts thereto. The ions are accelerated across a boundary layer surrounding the part and are implanted directly in the substrate. With this procedure, the implanted nitrogen layer is more uniform.

Implantation takes place with the substrate maintained at about room temperature although the temperature of the substrate during implantation can affect conductivity thereof. The resistance of a cold substrate will be higher than if implantation were made on a substrate maintained at a high temperature.

The thickness of the sub-surface non-diamond carbon layer below cap layer or below the top surface of the substrate will depend on many factors such as the mass of the implanted ions, the energy of the ions and the duration of implantation. However, the layer will typically be 10–1000 nm and more typically 20–500 nm in thickness.

The non-diamond carbon-layer is either graphite or amorphous carbon. Graphite is hexagonal carbon and it is crystalline, not amorphous. Whether one or the other is formed depends on the temperature of the diamond during ion implantation. If the diamond temperature is elevated during ion implantation, then a graphite layer can be formed. However, at lower temperatures, an amorphous carbon layer is formed. At temperatures above about 1000° C., graphite is formed and at temperatures below about 1000° C., amorphous carbon is formed. The term non-diamond carbon includes amorphous carbon and graphite. A layer of non-diamond carbon may contain small amounts of other atoms depending on the implanted ions, e.g., nitrogen, carbon, argon, helium, iron, and the like.

Ion implantation creates structural defects in the diamond cap layer as the ions traverse the upper portion of the diamond substrate. In their traversal through the cap layer of the substrate, the ions lose most of their kinetic energy by interactions with electrons and nuclei of the substrate and these interactions result in large changes in their path directions.

Annealing of the ion implanted diamond substrate is optional and can be carried out to improve quality of the implanted region. The purpose of the annealing operation is to at least partially remove damage caused by implantation and to remove at least some pin holes in the diamond cap layer. The anneal temperature can be in the approximate range of 500–1500° C., but is more typically in the approximate range of 600–1000° C., and is effected in an inert atmosphere or in a vacuum over a period of 1–16 hours, but typically 3–8 hours. During the annealing operation, the black damaged layer acquires a greenish or a purplish tinge.

After ion implantation of a diamond substrate, diamond can then be grown on top surface of the substrate by conventional vapor deposition. The planar extent of the grown diamond will depend on the planar extent of the substrate and thickness of the grown diamond will depend on thickness desired. By using a single crystal diamond substrate, a single crystal diamond can be grown homoepitaxially thereon. However, if the substrate is a polycrystalline diamond, only a polycrystalline diamond can be grown over such a substrate.

Chemical vapor deposition (CVD) is a low pressure growth of diamond. Two predominant CVD techniques have found favor. One of these techniques involves the use of a dilute mixture of hydrocarbon gas typically methane and hydrogen wherein the hydrocarbon content usually is varied from about 0.1% to 2.5% of the total volumetric flow. The gas is introduced via a quartz tube located just above a hot tungsten filament which is electrically heated to a temperature ranging between about 1750° to 2400° C. The gas mixture disassociates at the filament surface and diamonds are condensed onto a heated substrate placed just below the hot tungsten filament. The temperature of the substrate during diamond deposition should be in the approximate range 600–1200° C. The substrate is held in a resistance heated boat and heated to a high temperature.

The second technique involves the imposition of a plasma discharge to the foregoing filament process. The plasma discharge serves to increase the nucleation density, growth rate, and it is believed to enhance formation of diamond films as opposed to discrete diamond particles. Of the plasma systems that have been utilized in this area, there are three basic systems. One is a microwave plasma system, the second is an RF inductively or capacitively coupled plasma system, and the third is a d.c. plasma system. The RF and microwave plasma systems utilize relatively complex and expensive equipment which usually requires complex tuning or matching networks to electrically coupled electrical energy to the generated plasma. Additionally, the diamond growth rate offered by these two systems can be quite modest.

Atomic hydrogen is required regardless of the particular CVD technique utilized. Atomic hydrogen can be generated in numerous ways. Each way serves as a pathway to develop a new CVD diamond growth process. Atomic hydrogen can carry out the needed functions because of favorable relationships between energies for carbon—carbon, carbon-hydrogen, and hydrogen—hydrogen bonds.

The minimum thickness of the deposited diamond layer on diamond substrate can theoretically be monolayer and up to a maximum of any thickness desired. For practical reasons, however, the thickness of the grown diamond layer is typically in the approximate range of 50–100,000 nm, more typically 100–10,000 nm. The minimum and maximum thickness will be dictated by the use to which the diamond is put since certain applications tolerate only certain thicknesses.

Once diamond of the desired thickness is deposited on an ion implanted diamond substrate containing a layer of non-diamond carbon below the top of the substrate, the diamond assembly is placed in a liquid for electrochemical etching along the non-diamond carbon layer. The term "diamond assembly," as used herein, comprises the ion implanted diamond substrate containing a layer of non-diamond carbon disposed below the top surface of the substrate with a diamond cap disposed over the non-diamond carbon and the grown diamond disposed over the diamond cap and rigidly adhering thereto.

Electrochemical etching used herein is disclosed in U.S. Pat. No. 5,269,890 of inventor M. J. Marchywka which issued Dec. 14, 1993. The entirety of this patent is hereby incorporated by reference.

Separation of the diamond grown on the substrate along the damaged path created by the non-diamond carbon disposed some distance below the top surface of the substrate is typically effected by non-contact electrochemical etching which dissolves or disintegrates the non-diamond carbon layer under influence of an electric field. The term "non-contact" refers to a lack of electrical and/or physical contact between the substrate and the electrodes and the container in which the electrochemical etching takes place. After the non-diamond carbon layer is disintegrated or dissolved, the grown diamond and the cap attached thereto can float away from the substrate.

The electrochemical etching used herein is characterized by subjecting a liquid electrolyte to a voltage impressed between a pair of spaced electrodes to provide an electric field in the electrolyte. The strength of the electric field in the electrolyte required to obtain optimum etching of the non-diamond carbon depends on the type of electrolyte employed, the electrode spacing, the electrode material, and other considerations. However, the electric field in the electrolyte is typically in the approximate range of 1–200 v/cm, more typically 10–100 v/cm. For a small separation of the electrodes, the impressed voltage that can supply the requisite electric field in the electrolyte is in the approximate range of 5–5000 volts, more typically 10–1000 volts.

Suitable electrolytes that are effective herein include commercially available distilled water, aqueous solutions of acids such as chromic acid and boric acid, aqueous surfactant solutions, ammonium hydroxide, and strong acids such as sulfuric acid. Some of these electrolytes are nominally electrically non-conductive. Typically, dilute aqueous electrolyte solutions are used which have current density of about 1–100 na/cm$^2$ at an impressed voltage of about 50–300 volts.

Although the electrodes which provide the electric field in the electrolyte can be made of any suitable conducting material, the preferred material is carbon or a precious metal. Of particular interest are electrodes made of graphite or platinum—iridium. The spacing between the electrodes should be sufficient to accommodate the diamond assembly therebetween and to obtain the necessary electric field strength but the spacing should not be too great since etching rates are directly proportional to the spacing and the impressed voltage. Typically, the spacing between the electrodes is in the approximate range of 0.1–50 cm, more typically 0.5–20 cm. Generally, etching is effected in a period of time typically in the approximate range of 1 minute to 10 hours, more typically about one-half hour to 5 hours from the time the diamond assembly is placed into an electrolyte with the requisite electric field.

Electrochemical etching of the diamond assembly is carried out by placing the diamond assembly into an electrolyte between spaced electrodes and impressing a voltage across the electrodes to create the requisite electric field in the electrolyte. The electric field in the electrolyte must be sufficient to etch or to dissolve or to disintegrate the non-diamond carbon in the substrate created by ion implantation which is disposed below the top surface of the substrate. When a portion of the substrate is observed to have been etched, the cathode can be moved to another location closer to another, unetched or lightly etched portion. Also, the substrate can be moved relative to the electrodes in order to obtain the desired or a more uniform etch. If a substrate is larger than the width of the electric field, the entire substrate can be treated by moving one or both of the electrodes or moving the substrate.

Dissolution or disintegration of the non-diamond carbon allows the grown diamond on the substrate to separate with the diamond cap from the rest of the substrate and to form a diamond product. The term "diamond product," as used herein, denotes the grown diamond and the substrate cap adhering thereto after the electrochemical etch which dissolves the non-diamond carbon layer and separates the grown diamond and the substrate cap from the rest the substrate. Additional diamond products can be made by ion implantation of the diamond products produced or another diamond substrate from a commercial source and repeating the steps of growing diamond and electrochemical etching. The electrochemically etched surface is very similar to an unetched or virgin diamond surface, at least with respect to growing diamond by CVD thereon.

A larger diamond can be made from smaller or seed diamonds, such as the ones prepared herein, by placing a number of the smaller diamonds within a few to 10 microns of each other in a tiling or mosaicing process and then growing diamond film thereon. Film growth will begin on each smaller diamond individually but the film will grow laterally as well as vertically and eventually the films will grow together to form a continuous film of a larger dimension.

The following example further illustrates this invention, it i being understood that the invention is in no way intended to be limited to the details described therein.

EXAMPLE

This example demonstrates preparation of a diamond product comprising the steps of ion implanting a diamond substrate with carbon ions to create a layer of non-diamond carbon or the damaged layer with a diamond cap layer above the non-diamond carbon layer and the rest of the diamond substrate below the non-diamond carbon layer. The step of ion implanting is followed by the steps of growing a diamond film on the substrate cap by CVD, and non-contact electrochemical etching of the diamond assembly in order to separate from the rest of the diamond substrate the grown diamond and the cap adhering thereto along the path of the non-diamond carbon.

Identical diamond substrates A and B were used in these experiments. The only difference between substrates A and B was that substrate B was annealed after ion implantation but substrate A was not.

Each substrate was synthetic single crystal diamond measuring 3 mm×3 mm×2 mm with a (100) orientation mounted on a silicon wafer. Ion implantation of the substrate A and B was performed at room temperature at a low ion dose of 1×10$^{16}$ carbon atoms/cm$^2$ at a low energy of 175 keV. Ion implantation produced a layer of 50 nm of non-diamond carbon i.e., black damaged layer below the top surface of each substrate which layer extended from one end of the substrate to the opposite, parallel to the top surface. There was a 50 nm thick diamond cap layer above the non-diamond carbon layer. The substrates were originally yellow and clear but developed a black, opaque surface after ion implantation.

Only substrate B was annealed. Annealing conditions were 950° C., annealing duration was about 2 hours and the atmosphere was argon at about 1 atmosphere.

Homoepitaxial growth on the substrates was then performed in a microwave CVD system for 28 hours with 800 watts of input power and a pressure of 30 Torr. The substrate temperature was 830° C. The input gas stream was composed of 2.3 sccm of methane ($CH_4$), 1 sccm of oxygen ($O_2$), and 100 sccm of hydrogen ($H_2$). The resulting films on substrates were about 15 microns thick.

The assemblies A and B were visually examined after the diamond film growth. The assemblies retained their black layers of non-diamond carbon and the transmitted light microscopy revealed numerous pinholes across the grown film on substrate A, which was not annealed, but none on annealed substrate B, on the 3 mm×3 mm surface.

After diamond growth, assemblies A and B, composed of implanted substrates A and B and the grown diamond film on top of each, were exposed to the non-contact electrochemical etch in order to dissolve the non-diamond carbon layer in the substrates created by the ion implantation and thus separate the diamond product from the rest of the substrate.

In carrying out the electrochemical etch, each assembly was placed between a pair of platinum gauze electrodes spaced 2 cm apart in the directional geometry. The electrodes and the assemblies were immersed in distilled water containing sufficient chromic acid to allow 100 ma of current flow with 200 volts of applied bias. The electrodes were immersed in distilled water to the depth of 1 cm.

This technique allowed control of the etch rate and observation of etch progress as the black damaged layer disappeared. Subsurface gas evolution was monitored visually and controlled with the applied bias, thus reducing any risk of breaking the grown diamond film due to trapped gas generated during delamination.

Separation time, or the duration of the electrochemical etch, was about 10 hours for assembly B. It took about 6 hours to remove all the dark material, i.e., the non-diamond carbon created by the ion implantation and constituting the damaged layer through the substrate, but the diamond film grown on substrate A could not be removed intact due to the pinholes therein.

It should be recognized that the foregoing description and discussion are merely meant to illustrate the principles of the instant invention and it is not meant to be a limitation upon the practice thereof. It is the following claims, including all equivalents, which are meant to define the true scope of the instant invention.

What is claimed is:

1. A diamond product comprising a first diamond layer deposited by chemical vapor deposition and a second diamond layer adhering to said first layer, said second diamond layer containing damage resulting from ions traversing same.

2. The diamond product of claim 1 wherein said first layer is essentially devoid of pinholes and the damage in said second layer includes pinholes therein.

3. The diamond products of claim 1 wherein said first layer is single crystal diamond and wherein said second layer is single crystal diamond.

* * * * *